US009185815B2

(12) United States Patent
Hsu

(10) Patent No.: US 9,185,815 B2
(45) Date of Patent: Nov. 10, 2015

(54) TRANSMISSION STABILIZATION DEVICE APPLIED TO DUAL-SHAFT SYSTEM

(71) Applicant: FIRST DOME CORPORATION, New Taipei (TW)

(72) Inventor: An Szu Hsu, New Taipei (TW)

(73) Assignee: First Dome Corporation, New Taipei (TW)

( * ) Notice: Subject to any disclaimer, the term of this patent is extended or adjusted under 35 U.S.C. 154(b) by 0 days.

(21) Appl. No.: 14/172,989

(22) Filed: Feb. 5, 2014

(65) Prior Publication Data

US 2015/0189777 A1    Jul. 2, 2015

(30) Foreign Application Priority Data

Dec. 31, 2013  (TW) .............................. 102224991 U

(51) Int. Cl.
| | | |
|---|---|---|
| E05D 3/06 | (2006.01) | |
| H05K 5/02 | (2006.01) | |
| F16H 25/06 | (2006.01) | |
| F16H 57/021 | (2012.01) | |
| E05D 3/12 | (2006.01) | |

(52) U.S. Cl.
CPC ................ *H05K 5/0226* (2013.01); *E05D 3/06* (2013.01); *E05D 3/12* (2013.01); *F16H 25/06* (2013.01); *F16H 57/021* (2013.01); *Y10T 16/544* (2015.01); *Y10T 16/547* (2015.01); *Y10T 16/5474* (2015.01)

(58) Field of Classification Search
CPC combination set(s) only.
See application file for complete search history.

(56) References Cited

U.S. PATENT DOCUMENTS

| | | | | |
|---|---|---|---|---|
| 4,200,957 | A * | 5/1980 | Hsu ................................. | 16/314 |
| 4,242,773 | A * | 1/1981 | Beigh ............................. | 16/371 |
| 5,666,694 | A * | 9/1997 | Slow et al. ..................... | 16/368 |
| 7,414,834 | B2 * | 8/2008 | Ukonaho et al. ......... | 361/679.55 |
| 7,512,426 | B2 * | 3/2009 | Maatta et al. ............... | 455/575.1 |
| 7,738,930 | B2 * | 6/2010 | Petrella ....................... | 455/575.3 |
| 7,765,644 | B2 * | 8/2010 | Ueyama et al. .................. | 16/354 |
| 7,900,323 | B2 * | 3/2011 | Lin ................................. | 16/366 |
| 7,930,803 | B2 * | 4/2011 | Ueyama et al. ................. | 16/366 |
| 8,474,101 | B2 * | 7/2013 | Wang et al. ..................... | 16/366 |
| 8,615,848 | B2 * | 12/2013 | Mitsui ............................. | 16/366 |
| 2006/0236505 | A1 * | 10/2006 | Maatta et al. ................... | 16/366 |
| 2006/0238970 | A1 * | 10/2006 | Ukonaho et al. .............. | 361/683 |
| 2007/0094846 | A1 * | 5/2007 | Ishida ............................. | 16/354 |
| 2008/0307608 | A1 * | 12/2008 | Goto .............................. | 16/366 |
| 2009/0000062 | A1 * | 1/2009 | Yamanami ..................... | 16/366 |
| 2009/0013500 | A1 * | 1/2009 | Ueyama et al. ................. | 16/354 |
| 2011/0157780 | A1 * | 6/2011 | Wang et al. ............. | 361/679.01 |
| 2011/0289726 | A1 * | 12/2011 | Zhang et al. .................... | 16/250 |
| 2012/0096678 | A1 * | 4/2012 | Zhang et al. .................... | 16/302 |
| 2013/0318746 | A1 * | 12/2013 | Kuramochi ..................... | 16/342 |

* cited by examiner

*Primary Examiner* — Jeffrey O Brien
(74) *Attorney, Agent, or Firm* — Rosenberg, Klein & Lee

(57) ABSTRACT

A transmission stabilization device applied to dual-shaft system for stabilizing and smoothening the transmission and reducing wear of the components. The transmission stabilization device includes a first rotary shaft, a second rotary shaft and a transmission unit, which are assembled with each other. Each of the first and second rotary shafts has a fixed section mounted on an electronic apparatus, a pivoted section assembled with a torque module and a connection section. The transmission unit is drivingly engaged with the connection sections. The transmission unit is mounted on a fixing shaft. When the first or second rotary shaft rotates, the transmission unit is moved along the fixing shaft with the rotation of the first or second rotary shaft. The transmission stabilization device can prevent the transmission unit from swinging so as to overcome the problem of retardation of transmission of the conventional device.

12 Claims, 3 Drawing Sheets

TRANSMISSION STABILIZATION DEVICE APPLIED TO DUAL-SHAFT SYSTEM

BACKGROUND OF THE INVENTION

1. Field of the Invention

The present invention relates generally to a transmission stabilization device applied to dual-shaft system, and more particularly to a transmission stabilization device, which is assembled with two rotary shafts of the dual-shaft system for stabilizing the transmission of the transmission unit.

2. Description of the Related Art

There are various electronic apparatuses provided with covers or display screens, such as mobile phones, notebooks, PDA, and electronic books. The covers or display screens are pivotally mounted on the electronic apparatuses via pivot pins or rotary shafts, whereby the covers or display screens can be freely rotated and opened/closed under external force.

In order to operate the display module (such as the screen) and/or the apparatus body module of the electronic apparatus in more operation modes and application ranges, a dual-shaft mechanism is provided between the display module and the apparatus body module, whereby the display module and/or the apparatus body module can be operated in different operation modes by different rotational angles.

The surface of such dual-shaft mechanism (including first and second rotary shafts) is generally formed with spiral grooves. A transmission block is inlaid in the spiral grooves. When a user operates the display module or the apparatus body module to drive and rotate the first rotary shaft, the spiral groove of the first rotary shaft will force the transmission block to relatively move, whereby the second rotary shaft is synchronously rotated.

With respect to the structural design, operation and synchronous rotation of the above dual-shaft mechanism, when the first rotary shaft is rotated and the spiral groove of the first rotary shaft forces the transmission block to transversely move, the transmission block is likely to swing. This will cause wear of the transmission structure. Also, the transmission block can hardly smoothly drive the second rotary shaft to synchronously rotate. As a result, the transmission will be retarded and the electronic apparatus can be hardly smoothly operated and rotated.

The conventional dual-shaft mechanism and the relevant connection components thereof have some shortcomings in use and structural design that need to be overcome. It is therefore tried by the applicant to provide a transmission stabilization device applied to dual-shaft system to eliminate the shortcomings existing in the conventional device so as to widen the application range. For example, in comparison with the conventional dual-shaft mechanism, the pivot pin or rotary shaft is assembled with the transmission stabilization device. In response to the rotation of the electronic apparatus, the transmission stabilization device can stabilize and smoothen the move of the transmission mechanism and minimize the possibility of swing of the transmission mechanism. Also, the transmission stabilization device can further facilitate the assembling process of the dual-shaft mechanism and overcome the problem of retardation of transmission. In this case, the electronic apparatus can be more smoothly operated and rotated.

SUMMARY OF THE INVENTION

It is therefore a primary object of the present invention to provide a transmission stabilization device applied to dual-shaft system for stabilizing and smoothening the transmission and reducing wear of the components. The transmission stabilization device includes a first rotary shaft, a second rotary shaft and a transmission unit, which are assembled with each other. Each of the first and second rotary shafts has a fixed section mounted on an electronic apparatus, a pivoted section assembled with a torque module and a connection section. The transmission unit is drivingly engaged with the connection sections. The transmission unit is mounted on a fixing shaft. When the first or second rotary shaft rotates, the transmission unit is moved along the fixing shaft with the rotation of the first or second rotary shaft. The transmission stabilization device can prevent two ends of the transmission unit from swinging so as to overcome the problem of retardation of transmission of the conventional device.

In the above transmission stabilization device, the connection sections of the first and second rotary shafts and the transmission unit are enclosed in a fixing casing. The fixing casing includes a first chamber for receiving the connection section of the first rotary shaft, a second chamber for receiving the connection section of the second rotary shaft and a belly section in connection with the first and second chambers. The belly section defines a subsidiary chamber for receiving the transmission unit. The belly section is in contact with two walls of the transmission unit to restrict the transmission unit from laterally swinging.

The present invention can be best understood through the following description and accompanying drawings, wherein:

DETAILED DESCRIPTION OF THE PREFERRED EMBODIMENTS

Figure 1:
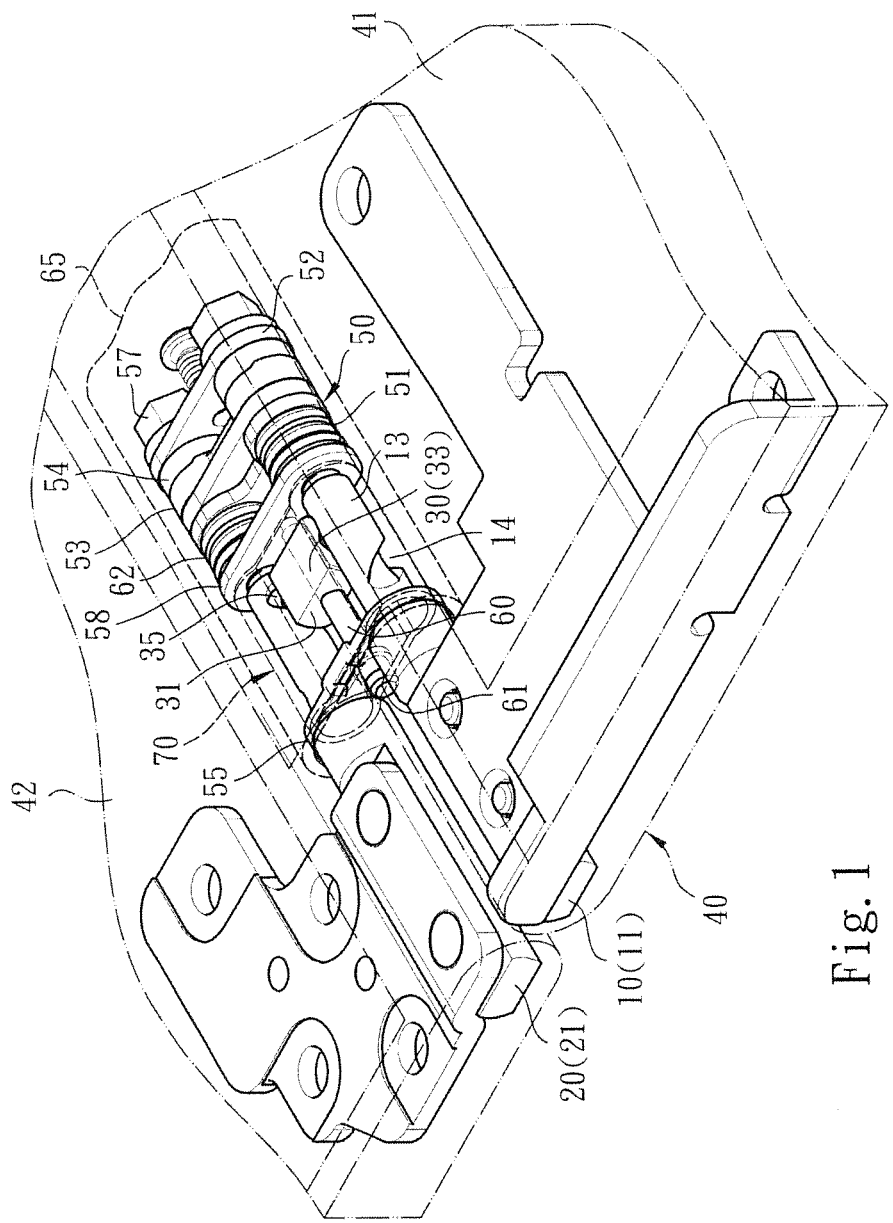
FIG. 1 is a perspective assembled view of the transmission stabilization device applied to dual-shaft system of the present invention, showing the cooperation between the first and second rotary shafts, the transmission unit, the fixing casing and the torque module, in which the phantom lines show an electronic apparatus on which the first and second rotary shafts are mounted.
Figure 2:
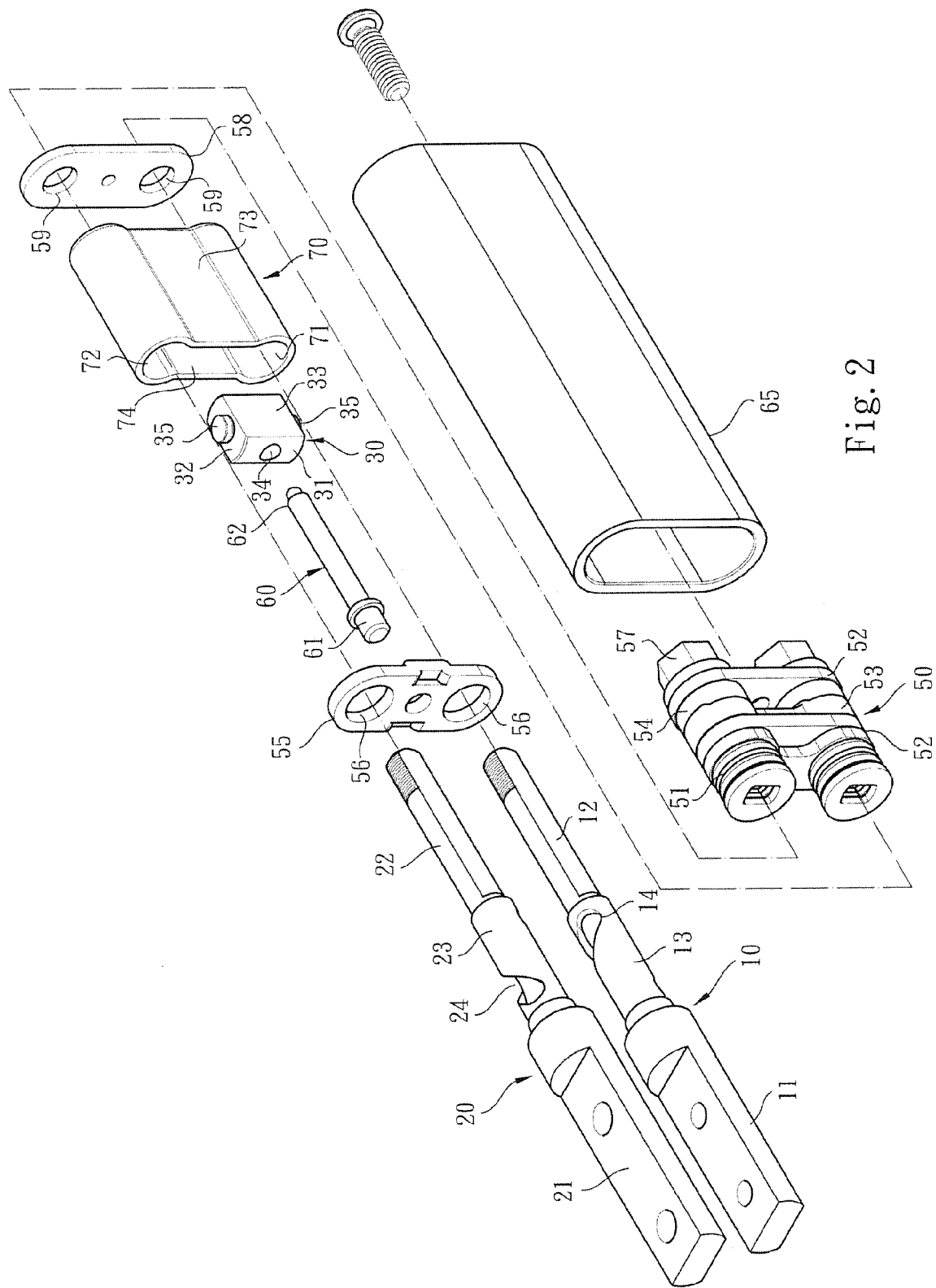
FIG. 2 is a perspective exploded view of the transmission stabilization device applied to dual-shaft system of the present invention, showing the structural form of the first and second rotary shafts, the transmission unit, the fixing casing and the torque module.
Figure 3:
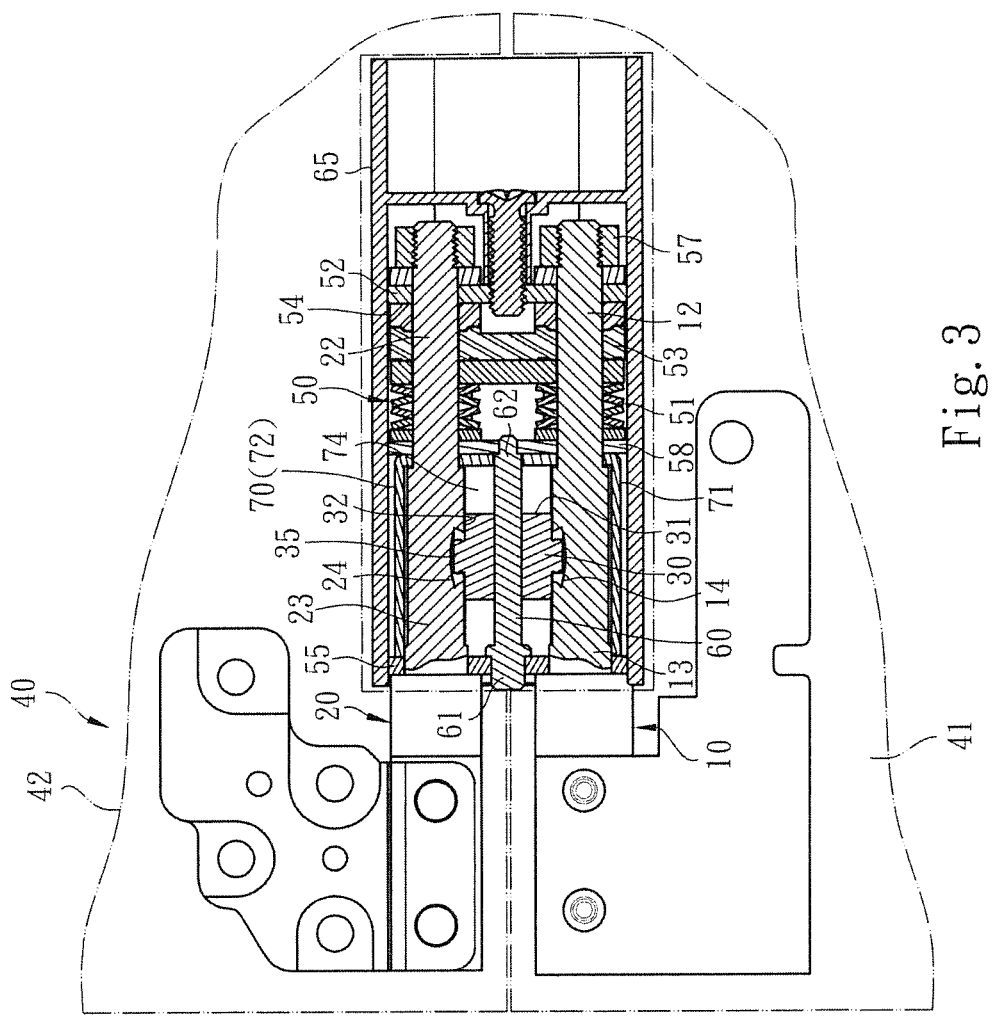
FIG. 3 is a plane sectional view of the transmission stabilization device applied to dual-shaft system of the present invention, showing the cooperation between the first and second rotary shafts, the transmission unit and the fixing casing.

Please refer to FIGS. 1, 2 and 3. According to a preferred embodiment, the transmission stabilization device applied to dual-shaft system of the present invention is assembled with an electronic apparatus (such as a computer) for illustration purposes. The transmission stabilization device includes a first rotary shaft 10, a second rotary shaft 20 and a transmission unit 30, which are assembled with each other. Each of the first and second rotary shafts 10, 20 has a fixed section 11, 21, a pivoted section 12, 22 and a connection section 13, 23 positioned between the fixed section 11, 21 and the pivoted section 12, 22.

The fixed section 11 of the first rotary shaft is connected with and disposed on an apparatus body module 41 of the electronic apparatus 40. The fixed section 21 of the second rotary shaft is connected with and disposed on a display module 42 of the electronic apparatus 40. The pivoted sections 21, 22 of the first and second rotary shafts 10, 20 are (respectively) assembled with a torque module 50. Accordingly, when the action force of a user for rotating the apparatus body module 41 or the display module 42 disappears, the first and second rotary shafts 10, 20 are immediately located.

In this embodiment, the transmission unit 30 is a block body having two ends 31, two sides 32 and two walls 33. The transmission unit 30 is disposed between the connection sections 13, 23 of the first and second rotary shafts 10, 20 for synchronously rotating the first and second rotary shafts 10, 20.

To speak more specifically, the transmission unit 30 is formed with a shaft hole 34 passing through the transmission unit 30 between two ends 31 thereof, whereby the transmission unit 30 can be mounted on a fixing shaft 60. The fixing shaft 60 has two ends 61, 62. A restriction plate 55 and a subsidiary plate 58 are respectively assembled at the two ends 61, 62 of the fixing shaft 60. When the first rotary shaft 10 or the second rotary shaft 20 rotates, the transmission unit 30 is moved along the fixing shaft 60 with the rotation of the first rotary shaft 10 or the second rotary shaft 20. The assembly structure of the shaft hole 34 of the transmission unit 30 and the fixing shaft 60 serves to prevent the two ends 31 of the transmission unit 30 from swinging.

As shown in FIGS. 2 and 3, each of two sides 32 of the transmission unit 30 is formed with a guide section 35 in the form of a boss. The connection sections 13, 23 of the first and second rotary shafts 10, 20 are formed with drive sections 14, 24 in the form of spiral grooves formed on the surfaces of the connection sections 13, 23. The guide sections 35 of the transmission unit 30 are respectively inlaid in the drive sections 14, 24. Accordingly, when a user operates and rotates the display module 42, the second rotary shaft 20 is driven and rotated to force the transmission unit 30 to drive and rotate the first rotary shaft 10 and the apparatus body module 41.

In a preferred embodiment, a fixing casing 70 is disposed around the connection sections 13, 23 of the first and second rotary shafts 10, 20 to enclose the transmission unit 30 and the fixing shaft 60.

As shown in the drawings, the restriction plate 55 and the subsidiary plate 58 and the torque module 50 are respectively positioned at two ends of the fixing casing 70 and mounted in a case 65 together with the fixing casing 70. Each of the restriction plate 55 and the subsidiary plate 58 is formed with two holes 56, 59 for the pivoted sections 12, 22 of the first and second rotary shafts 10, 20 to pass through. After the pivoted sections 12, 22 pass through a first chamber 71 and a second chamber 72 of the fixing casing 70, the pivoted sections 12, 22 are assembled with the torque module 50.

As shown in FIGS. 1, 2 and 3, the torque module 50 includes multiple spring gaskets 51 (or washers), fixing plates 52, 53, rotors 54 and fixing nuts 57. These components are assembled on the first and second rotary shafts 10, 20. The fixing plate 52 or 53 and the rotors 54 are formed with cooperative recessed/raised locating sections for helping in locating the apparatus body module 41 or the display module 42.

Figure 4:
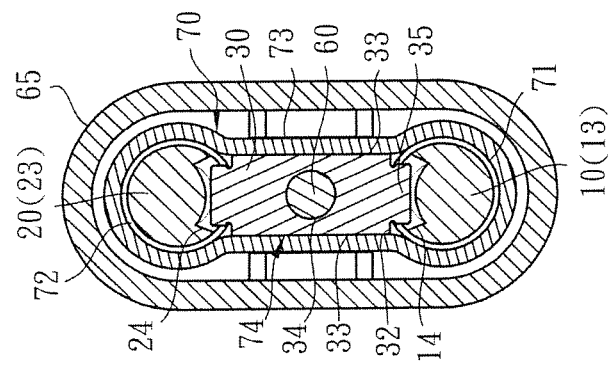
FIG. 4 is a sectional view of the transmission stabilization device applied to dual-shaft system of the present invention, showing the cooperation between the first and second rotary shafts, the transmission unit and the fixing casing.

As shown in the drawings, the fixing casing 70 is a casing structure with two open ends. The fixing casing 70 has a substantially 8-shaped cross section. The fixing casing 70 includes a first chamber 71, a second chamber 72 and a belly section 73 in connection with the first and second chambers 71, 72. The connection sections 13, 23 of the first and second rotary shafts 10, 20 are respectively fixedly assembled in the first and second chambers 71, 72. The belly section 73 of the fixing casing 70 defines a subsidiary chamber 74 in communication with the first and second chambers 71, 72 for receiving the transmission unit 30. As especially shown in FIG. 4, the belly section 73 is in contact with the two walls 33 of the transmission unit 30 to restrict the two walls 33 of the transmission unit 30 from laterally swinging.

It should be noted that when a user operates and rotates the display module 42, the second rotary shaft 20 is driven and rotated. At this time, the drive section 24 of the connection section 23 of the second rotary shaft forces the transmission unit 30 to move along the fixing shaft 60. Simultaneously, the drive section 13 of the first rotary shaft 10 is driven to make the first rotary shaft 10 and the apparatus body module 41 synchronously rotate. During the transmission process of the transmission unit 30, the two ends 31 of the transmission unit 30 are restricted and assembled on the fixing shaft 60 fitted through the shaft hole 34. Also, the two walls 33 of the transmission unit 30 are restricted within the belly section 73 or the subsidiary chamber 74 of the fixing casing 70. Accordingly, the transmission unit 30 is prevented from deflecting or swinging as in the conventional device.

It should be noted that FIG. 3 shows that the rotors 54 of the torque module 50 are mounted at the rear ends of the pivoted sections 12, 22 of the first and second rotary shafts. The rotors 54 are restricted between the fixing plate 53 and the fixing nuts 57. Therefore, when the recessed/raised locating sections of the rotors 54 are rotated relative to the recessed/raised locating sections of the fixing plate 53, the axial displacement of the pivoted sections 12, 22 of the first and second rotary shafts is restricted at the rear ends of the pivoted sections 12, 22 of the first and second rotary shafts. In this case, the operation gap (or axial displacement) of the entire torque module 50, which is caused by the relative rotation between the recessed/raised locating sections of the rotors 54 and the recessed/raised locating sections of the fixing plate 53 can be minimized. In contrast, in the conventional rotary shaft structure, the recessed/raised locating sections of the rotors and the recessed/raised locating sections of the fixing plate are cooperatively mounted on the middle sections of the rotary shafts. Under such circumstance, the torque module as a whole necessitates a larger movement tolerance. This will cause loosening or untightness of the rotary shaft assembly in operation/rotation of the electronic apparatus.

In comparison with the conventional device, the transmission stabilization device applied to dual-shaft system of the present invention has the following advantages:

1. The rotary shafts and the relevant components are redesigned and different from the conventional device in use and operation form. For example, the connection sections 13, 23 of the first and second rotary shafts 10, 20 are assembled with the transmission unit 30 and the fixing shaft 60. The two walls 33 of the transmission unit 30 are restricted within the belly section 73 of the fixing casing 70. The restriction plate 55 and the subsidiary plate 58 are respectively fixedly assembled at the two ends 61, 62 of the fixing shaft 60. When the electronic apparatus 40 is operated and rotated, the transmission of the transmission unit 30 can be stabilized and smoothened. Accordingly, the possibility of swing of the transmission device is minimized.

2. The transmission unit 30, the fixing shaft 60 and the fixing casing 70 can be easily assembled to overcome the problem of retardation of transmission of the conventional device. In this case, the electronic apparatus can be more smoothly operated and rotated.

In conclusion, the transmission stabilization device applied to the dual-shaft system of the present invention is different from and advantageous over the conventional device.

The above embodiments are only used to illustrate the present invention, not intended to limit the scope thereof. Many modifications of the above embodiments can be made without departing from the spirit of the present invention.

What is claimed is:

1. A transmission stabilization device applied to dual-shaft system, comprising:
a first rotary shaft;
a second rotary shaft; and
a transmission unit, the first and second rotary shafts being assembled with the transmission unit, each of the first and second rotary shafts having a fixed section, a pivoted section and a connection section, the transmission unit being disposed on a fixing shaft, whereby when the first rotary shaft or the second rotary shaft rotates, the transmission unit is moved along the fixing shaft with the rotation of the first rotary shaft or the second rotary shaft;
wherein the transmission unit is a block body having two ends, two sides and two walls, the transmission unit being disposed between the connection sections of the first and second rotary shafts for synchronously rotating the first and second rotary shafts, the transmission unit being formed with a shaft hole passing through the transmission unit between the two ends thereof, whereby the transmission unit is mounted on the fixing shaft, the fixing shaft having two ends, a restriction plate and a subsidiary plate being respectively fixedly assembled at the two ends of the fixing shaft, each of the two sides of the transmission unit being formed with a guide section, the connection sections of the first and second rotary shafts being formed with drive sections, the guide sections of the transmission unit being respectively drivingly engaged with the drive sections.

2. The transmission stabilization device applied to dual-shaft system as claimed in claim 1, wherein the fixed section of the first rotary shaft is connected with and disposed on an apparatus body module of an electronic apparatus, while the fixed section of the second rotary shaft is connected with and disposed on a display module of the electronic apparatus, the pivoted sections of the first and second rotary shafts being assembled with a torque module.

3. The transmission stabilization device applied to dual-shaft system as claimed in claim 1, wherein the guide sections of the transmission unit are in the form of bosses and the drive sections of the first and second rotary shafts are in the form of spiral grooves formed on surfaces of the connection sections, the guide sections of the transmission unit being inlaid in the drive sections.

4. The transmission stabilization device applied to dual-shaft system as claimed in claim 1, wherein the connection sections of the first and second rotary shafts, the transmission unit and the fixing shaft are received in a fixing casing, the fixing casing being a casing structure with two open ends, the fixing casing having a substantially 8-shaped cross section, the fixing casing including a first chamber, a second chamber and a belly section in connection with the first and second chambers, the connection sections of the first and second rotary shafts being respectively fixedly assembled in the first and second chambers, the belly section of the fixing casing defining a subsidiary chamber in communication with the first and second chambers for receiving the transmission unit, the belly section being in contact with the two walls of the transmission unit.

5. The transmission stabilization device applied to dual-shaft system as claimed in claim 2, wherein the connection sections of the first and second rotary shafts, the transmission unit and the fixing shaft are received in a fixing casing, the fixing casing being a casing structure with two open ends, the fixing casing having a substantially 8-shaped cross section, the fixing casing including a first chamber, a second chamber and a belly section in connection with the first and second chambers, the connection sections of the first and second rotary shafts being respectively fixedly assembled in the first and second chambers, the belly section of the fixing casing defining a subsidiary chamber in communication with the first and second chambers for receiving the transmission unit, the belly section being in contact with the two walls of the transmission unit.

6. The transmission stabilization device applied to dual-shaft system as claimed in claim 3, wherein the connection sections of the first and second rotary shafts, the transmission unit and the fixing shaft are received in a fixing casing, the fixing casing being a casing structure with two open ends, the fixing casing having a substantially 8-shaped cross section, the fixing casing including a first chamber, a second chamber and a belly section in connection with the first and second chambers, the connection sections of the first and second rotary shafts being respectively fixedly assembled in the first and second chambers, the belly section of the fixing casing defining a subsidiary chamber in communication with the first and second chambers for receiving the transmission unit, the belly section being in contact with the two walls of the transmission unit.

7. The transmission stabilization device applied to dual-shaft system as claimed in claim 4, wherein the restriction plate and the subsidiary plate are respectively positioned at two ends of the fixing casing and mounted in a case together with the fixing casing, each of the restriction plate and the subsidiary plate being formed with two holes for the pivoted sections of the first and second rotary shafts to pass through, the pivoted sections of the first and second rotary shafts passing through the first and second chambers of the fixing casing to assemble with the torque module.

8. The transmission stabilization device applied to dual-shaft system as claimed in claim 6, wherein the restriction plate and the subsidiary plate are respectively positioned at two ends of the fixing casing and mounted in a case together with the fixing casing, each of the restriction plate and the subsidiary plate being formed with two holes for the pivoted sections of the first and second rotary shafts to pass through, the pivoted sections of the first and second rotary shafts passing through the first and second chambers of the fixing casing to assemble with the torque module.

9. The transmission stabilization device applied to dual-shaft system as claimed in claim 7, wherein the torque module includes multiple spring gaskets, fixing plates, rotors and fixing nuts, which are assembled on the first and second rotary shafts, at least one of the fixing plates and the rotors being formed with cooperative recessed/raised locating sections.

10. The transmission stabilization device applied to dual-shaft system as claimed in claim 8, wherein the torque module includes multiple spring gaskets, fixing plates, rotors and fixing nuts, which are assembled on the first and second rotary shafts, at least one of the fixing plates and the rotors being formed with cooperative recessed/raised locating sections.

11. The transmission stabilization device applied to dual-shaft system as claimed in claim 9, wherein the rotors of the torque module are mounted at rear ends of the pivoted sections of the first and second rotary shafts, the rotors being restricted between the fixing plate with the recessed/raised locating sections and the fixing nuts.

12. The transmission stabilization device applied to dual-shaft system as claimed in claim 10, wherein the rotors of the torque module are mounted at rear ends of the pivoted sections of the first and second rotary shafts, the rotors being restricted between the fixing plate with the recessed/raised locating sections and the fixing nuts.

\* \* \* \* \*